(12) United States Patent
Shim

(10) Patent No.: US 9,236,130 B2
(45) Date of Patent: Jan. 12, 2016

(54) SEMICONDUCTOR MEMORY DEVICE BEING CAPABLE OF REDUCING PROGRAM DISTURBANCE AND PROGRAM METHOD THEREOF

(71) Applicant: SK hynix Inc., Icheon-si Gyeonggi-do (KR)

(72) Inventor: Jung Woon Shim, Incheon (KR)

(73) Assignee: SK Hynix Inc., Gyeonggi-do (KR)

( * ) Notice: Subject to any disclaimer, the term of this patent is extended or adjusted under 35 U.S.C. 154(b) by 71 days.

(21) Appl. No.: 14/190,307

(22) Filed: Feb. 26, 2014

(65) Prior Publication Data

US 2015/0155040 A1 Jun. 4, 2015

(30) Foreign Application Priority Data

Dec. 2, 2013 (KR) ........................ 10-2013-0148721

(51) Int. Cl.
*G11C 16/06* (2006.01)
*G11C 16/10* (2006.01)
*G11C 16/04* (2006.01)
*G11C 16/24* (2006.01)

(52) U.S. Cl.
CPC ............ *G11C 16/10* (2013.01); *G11C 16/0483* (2013.01); *G11C 16/24* (2013.01)

(58) Field of Classification Search
CPC ......... G11C 16/24; G11C 16/10; G11C 16/26
USPC .................. 365/185.25, 185.05, 63, 185.17
See application file for complete search history.

(56) References Cited

U.S. PATENT DOCUMENTS

| | | | | |
|---|---|---|---|---|
| 8,923,047 | B2 * | 12/2014 | Choi ........................ | 365/185.05 |
| 2013/0258771 | A1 * | 10/2013 | Lee et al. ................ | 365/185.02 |
| 2014/0056069 | A1 * | 2/2014 | Park et al. ............... | 365/185.05 |
| 2014/0347921 | A1 * | 11/2014 | Shim ....................... | 365/185.02 |

FOREIGN PATENT DOCUMENTS

| KR | 1020110032797 A | 3/2011 |
|---|---|---|
| KR | 1020120069110 A | 6/2012 |

* cited by examiner

*Primary Examiner* — Connie Yoha
(74) *Attorney, Agent, or Firm* — William Park & Associates Ltd.

(57) ABSTRACT

Provided are a semiconductor memory device and an operating method thereof. The semiconductor memory device includes a memory cell array including a plurality of strings, wherein each of the plurality of strings includes a first memory cell group, and a second memory cell group and peripheral circuits configured to generate a first precharge voltage applied to the first memory cell group and a second precharge voltage applied to the second memory cell group when a channel precharge operation is performed during a program operation, and generate a program voltage to apply the program voltage to the memory cell array when a program voltage application is performed.

20 Claims, 6 Drawing Sheets

SEMICONDUCTOR MEMORY DEVICE BEING CAPABLE OF REDUCING PROGRAM DISTURBANCE AND PROGRAM METHOD THEREOF

CROSS-REFERENCE TO RELATED APPLICATION

The present application claims priority to Korean patent application number 10-2013-0148721 filed on Dec. 2, 2013, in the Korean Intellectual Property Office, the entire disclosure of which is incorporated by reference herein.

BACKGROUND

1. Technical Field

The invention relates to an electronic device, and more specifically, to a semiconductor memory device and an operating method thereof.

2. Related Art

A semiconductor memory device is a memory device implemented using a semiconductor, such as silicon (Si), germanium (Ge), gallium arsenide (GaAs), indium phosphide (InP), etc. The semiconductor memory device can be generally classified as a volatile memory device or a nonvolatile memory device.

A volatile memory device is a memory device in which data stored therein is erased when power supply is cut off. Volatile memory devices include a static random access memory (SRAM), a dynamic RAM (DRAM), a synchronous DRAM (SDRAM), etc. A nonvolatile memory device is a memory device in which data stored therein is retained even when power supply is cut off. Nonvolatile memory devices include a read only memory (ROM), a programmable ROM (PROM), an electrically programmable ROM (EPROM), an electrically erasable and programmable ROM (EEPROM), a flash memory, a phase-change RAM (PCRAM), a magnetic RAM (MRAM), a resistive RAM (ReRAM), a ferroelectric RAM (FeRAM), etc. Flash memories are widely classified into a NOR-type and a NAND-type.

A flash memory device may be classified as a 2-dimensional semiconductor device in which strings are formed on a semiconductor substrate in a horizontal direction, or a 3-dimensional semiconductor device in which strings are formed on a semiconductor substrate in a vertical direction.

The 3-dimensional semiconductor device is a memory device developed to overcome a limitation of a degree of integration of the 2-dimensional semiconductor device, and thus includes a plurality of strings formed in a vertical direction on the semiconductor substrate. The strings include a drain select transistor, memory cells and a source select transistor connected in series between a bit line and a source line.

SUMMARY

An aspect of the present invention provides a semiconductor memory device. The semiconductor memory device includes a memory cell array including a plurality of strings, wherein each of the plurality of strings includes a first memory cell group and a second memory cell group; and peripheral circuits configured to generate a first precharge voltage applied to the first memory cell group and a second precharge voltage applied to the second memory cell group when a channel precharge operation is performed during a program operation, and generate a program voltage to apply the program voltage to the memory cell array when a program voltage application is performed.

An aspect of the present invention provides a semiconductor memory device including a plurality of memory cells stacked on a substrate. The semiconductor memory device includes a first memory cell group and a second memory cell group; a voltage generator configured to generate a first precharge voltage, a second precharge voltage and a program voltage; and a controller configured to apply the first precharge voltage to the first memory cell group, and the second precharge voltage to the second memory cell group.

An aspect of the present invention provides an operating method of a semiconductor memory device. The operating method includes providing a semiconductor device including a first memory cell group and a second memory cell group, applying a first precharge voltage to the first memory cell group and a second precharge voltage to the second memory cell group, and precharging channels corresponding to the first memory cell group and the second memory cell group, and applying a program voltage to a memory cell group selected from the first memory cell group and the second memory cell group.

BRIEF DESCRIPTION OF THE DRAWINGS

The above and other features and advantages of the invention will become more apparent to those of ordinary skill in the art by describing in detail various embodiments thereof with reference to the attached drawings in which.

DETAILED DESCRIPTION

Advantages and features of the invention, and implementation methods thereof will be clarified through the following embodiments described with reference to the accompanying drawings. The invention may, however, be embodied in different forms and should not be construed as limited to the embodiments set forth herein. Hereinafter, embodiments of the invention will be described in detail such that a person skilled in the art may carry out the technical idea of the invention easily.

In this disclosure below, when one part is referred to as being "connected" to another part, it should be understood that the former can be "directly connected" to the latter, or "indirectly connected" to the latter via an intervening part. Furthermore, when one part is referred to as "comprising" (or "including" or "having") other elements, it should be understood that it can comprise (or include or have) only those elements, or elements other than those elements if there is no specific limitation.

Figure 1:
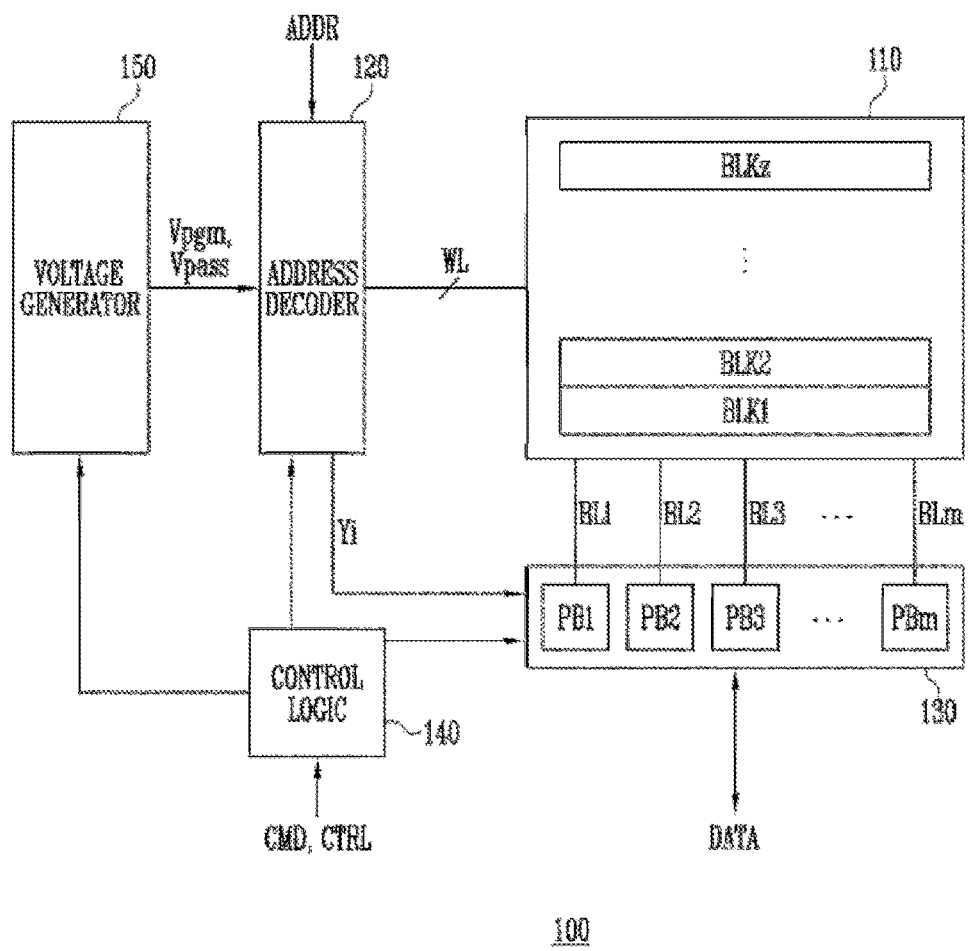
FIG. 1 is a block diagram illustrating a semiconductor memory device according to an embodiment of the present invention.

FIG. 1 is a block diagram illustrating a semiconductor memory device according to an embodiment of the present invention.

Referring to FIG. 1, the semiconductor memory device 100 includes a memory cell array 110, an address decoder 120, a read/write circuit 130, a control logic 140 and a voltage generator 150.

The memory cell array 110 includes a plurality of memory blocks BLK1 to BLKz. The plurality of memory blocks BLK1 to BLKz are electrically coupled to the address decoder 120 through word lines WL. The plurality of memory blocks BLK1 to BLKz are electrically coupled to the read/write circuit 130 through bit lines BL1 to BLm. Each of the plurality of memory blocks BLK1 to BLKz includes a plurality of memory cells. As an embodiment, the plurality of memory cells include nonvolatile memory cells. In the plurality of memory cells, memory cells coupled to the same word line are defined as one page. That is, the memory cell array 110 is configured with a plurality of pages.

In addition, each of the plurality of memory blocks BLK1 to BLKz of the memory cell array 110 includes a plurality of strings. Each of the plurality of strings includes a drain select transistor, a first memory cell group, a pipe transistor, a second memory cell group and a source select transistor connected in series between the bit line and a source line. The first memory cell group may be coupled between the pipe transistor and the bit line in a vertical direction. The first memory cell group may also be electrically coupled between the drain select transistor and the pipe transistor. The second memory cell group may be coupled between the pipe transistor and the source line in a vertical direction. The second memory cell group may also be coupled between the source select transistor and the pipe transistor.

The address decoder 120, the read/write circuit 130, and the voltage generator 150 operate as peripheral circuits to drive the memory cell array 110.

The address decoder 120 is electrically coupled to the memory cell array 110 through the word lines WL. The address decoder 120 is configured to operate in response to control of the control logic 140. The address decoder 120 receives an address ADDR through an input/output buffer (not shown) in the semiconductor memory device 100.

When a program operation is performed, the address decoder 120 applies a first precharge voltage V1 and a second precharge voltage V2 generated from the voltage generator 150 to the first memory cell group and the second memory cell group, respectively. Channels corresponding to the first memory cell group and the second memory cell group may be precharged. In addition, the address decoder 120 decodes a row address among the addresses ADDR received during the program operation, applies a program voltage Vpgm generated from the voltage generator 150 to the word lines selected among the plurality of word lines WL based on the decoded row address, and applies a pass voltage Vpass to the remaining unselected word lines.

The address decoder 120 is configured to decode a column address among the received addresses ADDR. The address decoder 120 transmits the decoded column addresses Yi to the read/write circuit 130.

The program operation of the semiconductor memory device 100 is performed in units of pages. The address ADDR received when a read operation and the program operation are requested includes a block address, a row address and a column address. The address decoder 120 selects one memory block and one word line based on the block address and the row address. The column address is decoded by the address decoder 120, and is provided to the read/write circuit 130.

The address decoder 120 may include a block decoder, a row decoder, a column decoder and an address buffer.

The read/write circuit includes a plurality of page buffers PB1 to PBm. The plurality of page buffers PB1 to PBm are electrically coupled to the memory cell array 110 through the bit lines BL1 to BLm. Each of the plurality of page buffers PB1 to PBm receives and temporarily stores program data when the program operation is performed, and controls a potential level of the corresponding bit line to be a program permission voltage or program prohibition voltage based on program data. In addition, each of the plurality of page buffers PB1 to PBm senses a program state of the corresponding memory cell during a program verification operation, and verifies whether the corresponding memory cell is programmed in comparison with the temporary stored program data during the program operation.

The read/write circuit 130 operates in response to control of the control logic 140.

In an embodiment, the read/write circuit 130 may include the page buffers (or page registers), a column selecting circuit, etc.

The control logic 140 is coupled to the address decoder 120, the read/write circuit 130, and the voltage generator 150. The control logic 140 receives a command CMD and control signal CTRL through an input/output buffer in the semiconductor memory device 100. The control logic 140 is configured to control overall operations of the semiconductor memory device 100 in response to the command CMD. In addition, the control logic 140 controls the voltage generator 150 to generate the first and second precharge voltages V1 and V2 to apply to the memory cell array 110 prior to the program voltage Vpgm. The program voltage Vpgm may be applied to a memory cell group selected from the first memory cell group and the second memory cell group. Here, the second precharge voltage V2 is higher than the first precharge voltage V1 by an offset voltage.

The voltage generator 150 generates the first precharge voltage V1 and the second precharge voltage V2 according to control of the control logic 140 when a channel precharge operation on memory cell array 110 is performed during the program operation. In addition, the voltage generator 150 generates the program voltage Vpgm and the pass voltage Vpass when the program voltage is applied during the program operation. The peripheral circuits (The address decoder 120, the read/write circuit 130, and the voltage generator 150) may be configured to generate a first precharge voltage V1 applied to the first memory cell group and a second precharge voltage V2 applied to the second memory cell group when a precharge operation is performed during a program operation; and generate a program voltage Vpgm to apply the program voltage Vpgm to the memory cell array 110 when a program voltage application is performed. The peripheral circuits (The address decoder 120, the read/write circuit 130, and the voltage generator 150) may apply the first precharge voltage V1 to the first memory cell group and the second precharge voltage V2 to the second memory cell group during the channel precharge operation.

Figure 2:
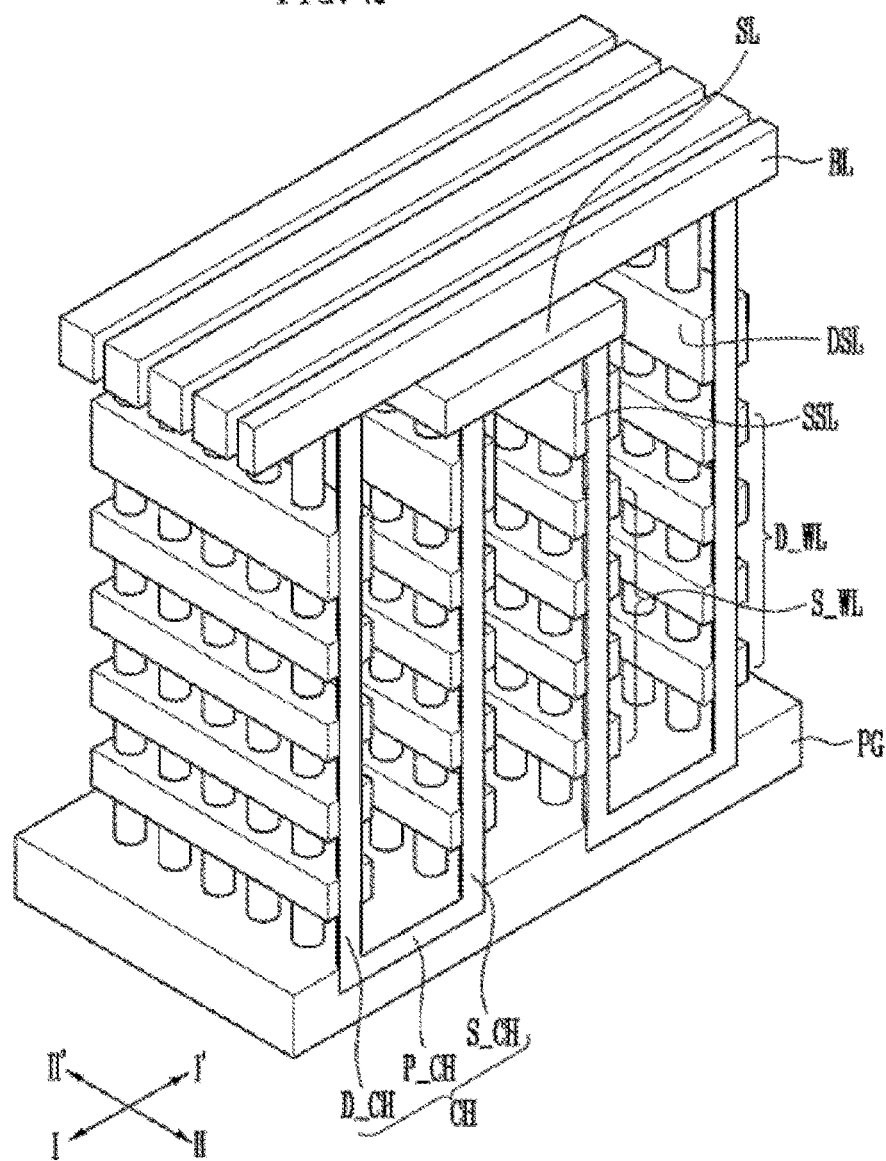
FIG. 2 is a perspective view showing a structure of a 3-dimensional semiconductor memory device according to an embodiment of the present invention.

FIG. 2 is a perspective view showing a structure of a 3-dimensional semiconductor memory device according to an embodiment of the present invention. Here, interlayer insulating layers are omitted for the sake of convenient explanation.

As illustrated in FIG. 2, the semiconductor memory device includes U-type channel layers CH arranged in a first direction I-I' and a second direction II-II' crossing the first direction I-I'. Here, the U-type channel layers CH include a pipe channel layer P_CH formed in a pipe gate PG and a pair of a source side channel layer S_CH and a drain side channel layer D_CH electrically coupled to the pipe channel layer P_CH.

Furthermore, the semiconductor memory device includes source side word line layers S_WL stacked along the source side channel layer S_CH on the pipe gate PG and drain side word line layers D_WL stacked along the drain side channel layer D_CH on the pipe gate PG. Here, a source select line layer SSL is stacked on the source side word line layers S_WL and a drain select line layer DSL is stacked on the drain side word line layer D_WL.

According to the above structure, memory cells MC are stacked along the U-type channel layer CH, and the drain select transistor DST and the source select transistor SST are provided at both ends of the U-type channel layer CH. Thus, the strings are arranged in a U type. Further, the pipe gate PG disposed on the lowermost of the U-type strings is disposed at a middle location of the memory cells MC and acts as a pipe transistor.

Moreover, in the semiconductor memory device, the bit line layers BL electrically coupled to the drain side channel layer D_CH and extending in the first direction I-I', and the source line layer SL electrically coupled to the source side channel layer S_CH and extending in the second direction II-IF are provided.

Figure 3:
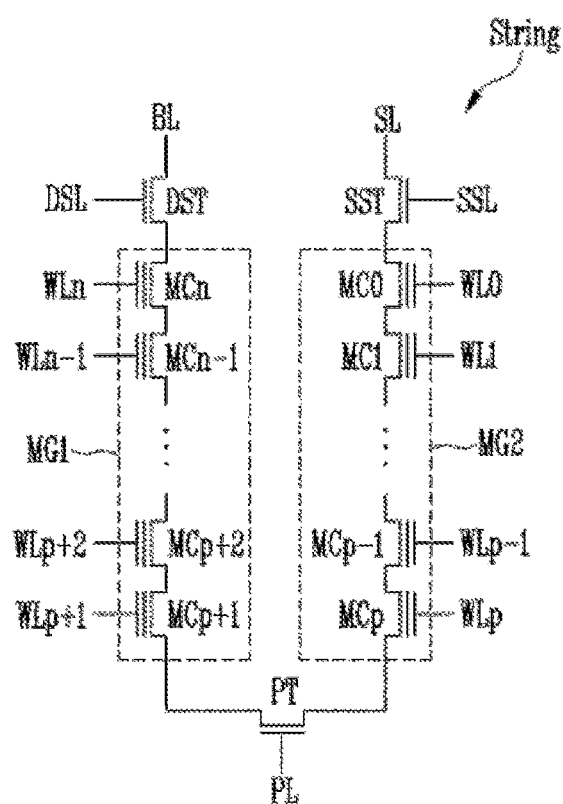
FIG. 3 is a circuit diagram illustrating a U-type string according to an embodiment of the present invention.

FIG. 3 is a circuit diagram illustrating a U-type string according to an embodiment of the present invention.

Referring to FIG. 3, the string includes a drain select transistor DST, a first memory cell group MG1, a pipe transistor PT, a second memory cell group MG2, and a source select transistor SST connected in series between the bit line BL and the source line SL.

The first memory cell group MG1 includes $p+1^{st}$ to $n^{th}$ memory cells MCp+1 to MCn, and the second memory cell group MG2 includes 0th to $p^{th}$ memory cells MC0 to MCp.

A gate of the drain select transistor DST is electrically coupled to the drain select line DSL, and a gate of the source select transistor SST is electrically coupled to the source select line SSL. The $p+1^{st}$ to $n^{th}$ memory cells MCp+1 to MCn of the first memory cell group MG1 are electrically coupled to the word lines WLp+1 to WLn, respectively, and the $0^{th}$ to $p^{th}$ memory cells MC0 to MCp of the second memory cell group MG2 are electrically coupled to the word lines WL0 to WLp, respectively. A gate of the pipe transistor PT is electrically coupled to the pipe line PL.

Figure 4:
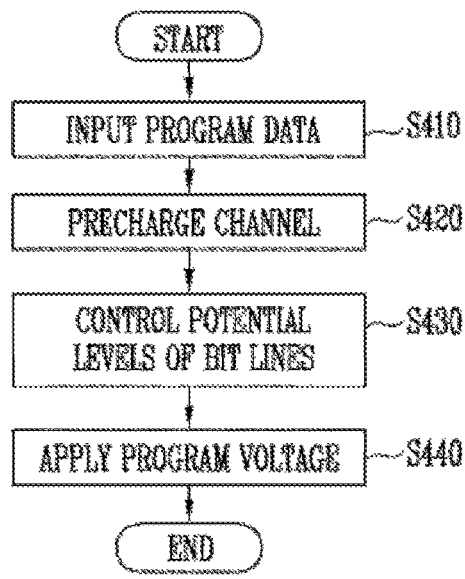
FIG. 4 is a flowchart illustrating program operations of a semiconductor memory device according to an embodiment of the present invention.

FIG. 4 is a flowchart illustrating program operations of a semiconductor memory device according to an embodiment of the present invention.

Figure 5:
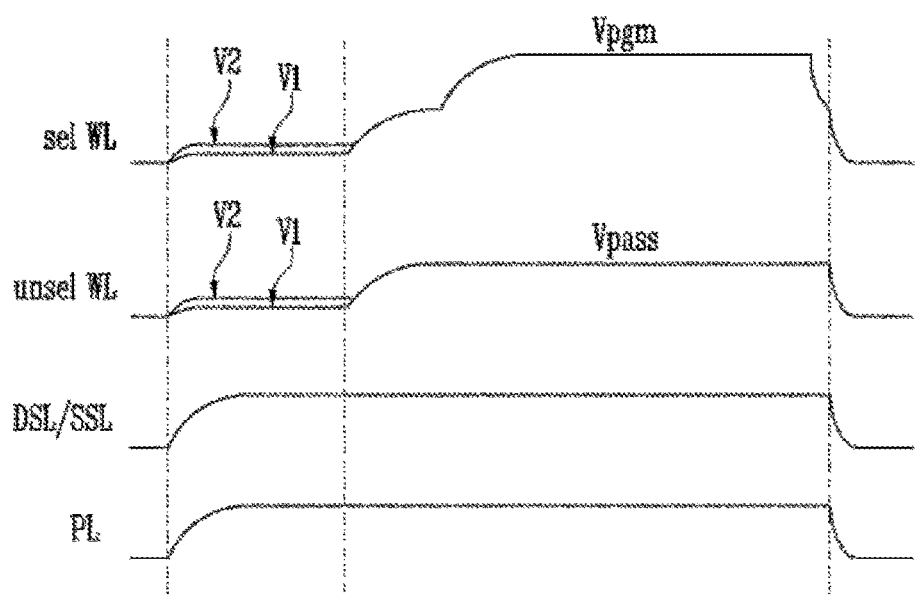
FIG. 5 is waveform diagrams of signals illustrating program operations of a semiconductor memory device according to an embodiment of the present invention.

FIG. 5 is waveform diagrams of signals illustrating program operations of a semiconductor memory device according to an embodiment of the present invention.

Referring to FIGS. 1 to 5, the operations of the semiconductor memory device according to the invention will be described as follows.

1) Input Program Data (S410)

When the program data and the address ADDR are input from the outside, the address decoder 120 decodes the column address among the received addresses ADDR and transmits the column address Yi to the read/write circuit 130. The read/write circuit 130 temporarily stores the program data in the page buffers PB1 to PBm in response to the decoded column address Yi.

2) Precharge Channel (S420)

The voltage generator 150 generates the first precharge voltage V1 and the second precharge voltage V2 according to control of the control logic 140. The control logic 140 controls the voltage generator 150 so that a potential level of the second precharge voltage V2 is higher than that of the first precharge voltage V1 by an offset voltage. Here, the first precharge voltage V1 may be in a range of 0 V to 1.5 V, and the offset voltage may be in a range of 0 V to 3 V. Further, the offset voltage may be adjusted in units of a step value of 0.2 V.

The address decoder 120 applies the first precharge voltage V1 and the second precharge voltage V2 generated from the voltage generator 150 to the plurality of strings included in the memory cell array 110. Here, the first precharge voltage V1 is applied to the word lines WLp+1 to WLn electrically coupled to the $p+1^{st}$ to $n^{th}$ memory cells MCp+1 to MCn of the first memory cell group MG1, and the second precharge voltage V2 is applied to the word lines WL0 to WLp electrically coupled to the $0^{th}$ to $p^{th}$ memory cells MC0 to MCp of the second memory cell group MG2.

Thus, a precharge potential level of a channel corresponding to the second memory cell group MG2 is precharged higher than that of a channel corresponding to the first memory cell group MG1. The peripheral circuits (address decoder 120, the read/write circuit 130, and the voltage generator 150) may apply the first precharge voltage V1 and the second precharge voltage V2 so that a potential level of a channel corresponding to the second memory cell group is higher than that of a channel corresponding to the first memory cell group. This compensates for the fact that a channel boosting level of the first memory cell group MG1 adjacent to the drain select transistor DST is higher than that of the second memory cell group MG2 adjacent to the source select transistor SST during a next program voltage application operation.

3) Control Potential Levels of Bit Lines (S430)

The page buffers PB1 to PBm control potential levels of bit lines of the corresponding bit lines BL1 to BLm based on the temporary stored program data. That is, the page buffers PB1 to PBm apply the program permission voltage or program prohibition voltage to the corresponding bit lines based on the temporary stored program data.

4) Apply Program Voltage (S440)

The voltage generator 150 generates the program voltage Vpgm and the pass voltage Vpass according to control of the control logic 140.

The address decoder 120 decodes a row address among the addresses ADDR received during the program operation, applies the program voltage Vpgm generated from the voltage generator 150 to the selected word lines among the plurality of word lines Wpgn according to the decoded row address, and applies the pass voltage Vpass to the remaining unselected word lines.

According to an embodiment, the first precharge voltage is applied to the first memory cell group electrically coupled between the bit line and the pipe transistor and the second precharge voltage is applied to the second memory cell group electrically coupled between the source line and the pipe transistor, and thus precharge voltages of channels differ on the basis of a pipe transistor, thereby mitigating a program disturbance phenomenon by compensating for different boosting levels according to locations of the memory cells during the next program voltage application operation.

Figure 6:
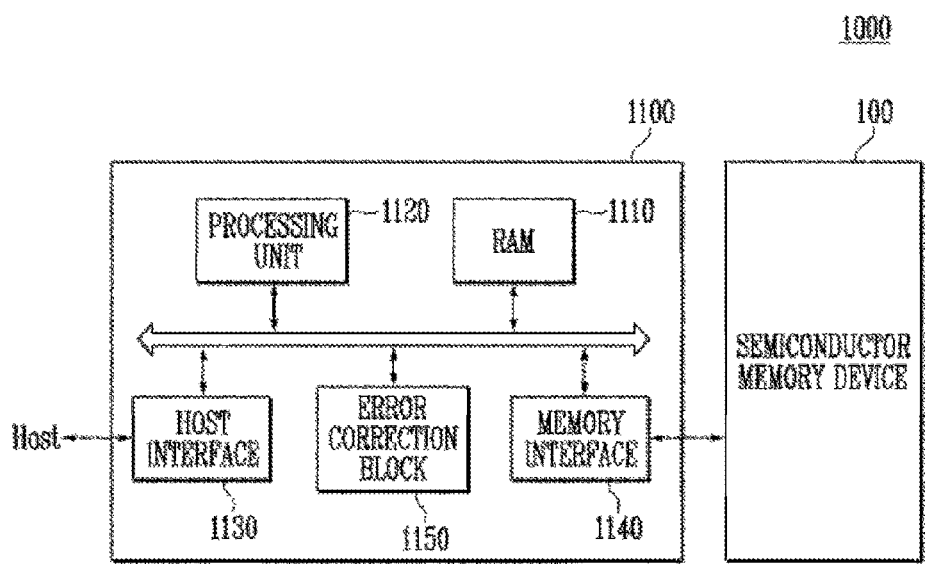
FIG. 6 is a block diagram showing a memory system including the semiconductor memory device of FIG. 1.

FIG. 6 is a block diagram showing a memory system including the semiconductor memory device of FIG. 1.

Referring to FIG. 6, the memory system 1000 includes a semiconductor memory device 100 and a controller 1100.

The semiconductor memory device 100 may be configured and operate as described with reference to FIG. 1. Hereinafter, duplicated descriptions will be omitted.

The controller 1100 is electrically coupled to a host Host and the semiconductor memory device 100. The controller 1100 is configured to access the semiconductor memory device 100 in response to a request from the host Host. For example, the controller 1100 is configured to control a read operation, a write operation, an erase operation and a background operation of the semiconductor memory device 100. The controller 1100 is configured to provide interfacing between the semiconductor memory device 100 and the host Host. The controller 1100 is configured to drive firmware in order to control the semiconductor memory device 100.

The controller 1100 includes a random access memory (RAM) 1110, a processing unit 1120, a host interface 1130, a memory interface 1140 and an error correction block 1150. The RAM 1110 is used as at least one of an operating memory of the processing unit 1120, a cache memory between the semiconductor memory device 100 and the host Host, and a buffer memory between the semiconductor memory device 100 and the host Host. The processing unit 1120 controls overall operations of the controller 1100. In addition, the controller 1100 may temporarily store program data provided from the host Host when a write operation is performed.

The host interface 1130 includes a protocol for exchanging data between the host Host and the controller 1100. In an embodiment, the controller 1200 is configured to communicate with the host Host through at least one of various protocols such as a Universal Serial Bus (USB) protocol, a MultiMediaCard (MMC) protocol, a Peripheral Component Interconnection (PCI) protocol, a PCI-Express (PCI-E) protocol, an Advanced Technology Attachment (ATA) protocol, a Serial-ATA protocol, a Parallel-ATA protocol, a Small Computer System Interface (SCSI) protocol, an Enhanced Small Disk Interface (ESDI) protocol, an Integrated Drive Electronics (IDE) protocol, a private protocol, etc.

The memory interface 1140 interfaces with the semiconductor memory device 100. For example, the memory interface 1140 includes a NAND-interface or NOR-interface.

The error correction block 1150 detects and corrects a data error received from the semiconductor memory device 100 using an error correction code (ECC). The processing unit 1120 adjusts a read voltage according to the result of error detection of the error correction block 1150, and controls the semiconductor memory device 100 to perform a reread operation. In an embodiment, the error correction block 1150 may be provided as a component of the controller 1100.

The controller 1100 and the semiconductor memory device 100 may be integrated as one semiconductor device. In an embodiment, the controller 1100 and the semiconductor memory device 100 may be integrated as one semiconductor device configuring a memory card. For example, the controller 1100 and the semiconductor memory device 100 may be integrated as one semiconductor device to configure a memory card, such as a PC card (Personal Computer Memory Card International Association (PCMCIA)), a CompactFlash (CF) Card, a SmartMedia (SM) Card (SMC), a Memory Stick, an MMC (RS-MMC or MMCmicro), an SD card (e.g., SD, miniSD, microSD or SDHC), a Universal Flash Storage (UFS), etc. The controller 1100 may be configured to apply the first precharge voltage V1 to the first memory cell group, and the second precharge voltage V2 to the second memory cell group. The controller 1100 may apply the first precharge voltage V1 to the first memory cell group and the second precharge voltage V2 to the second memory cell group during precharge operations of channels of the first memory cell group and the second memory cell group when a program operation is performed. The controller 1100 may apply the first precharge voltage V1 and the second precharge voltage V2 so that a potential level of a channel corresponding to the second memory cell group is higher than that of a channel corresponding to the first memory cell group. In addition, the controller 1100 may be configured to control the voltage generator 150 such that the second precharge voltage V2 has a higher potential level than the first precharge voltage V1 by an offset voltage.

The controller 1100 and the semiconductor memory device 100 may be integrated as one semiconductor device to configure a semiconductor drive (e.g., solid state drive (SSD)). The semiconductor drive includes a storage device configured to store data in the semiconductor memory. When the memory system 2000 is used as the semiconductor drive, an operating speed of the host Host coupled to the memory system 2000 is dramatically improved.

In another example, the memory system 1000 is provided as one of various components of electronic devices, such as a computer, an ultra-mobile PC (UMPC), a workstation, a netbook, a personal digital assistant (PDA), a portable computer, a web tablet, a wireless phone, a mobile phone, a smartphone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, a digital video player, a device capable of transmitting and receiving information in a wireless environment, one of various electronic devices configuring a home network, one of various electronic devices configuring a computer network, one of various electronic devices configuring a telematics network, an RFID device, or one of various components configuring a computing system.

In an embodiment, the semiconductor memory device 100 or the memory system 1000 may be mounted in various types of packages. For example, the semiconductor memory device 100 or the memory system 2000 may be packaged and mounted in the form of a package on package (PoP), ball grid arrays (BGAs), chip scale packages (CSPs), a plastic leaded chip carrier (PLCC), a plastic dual in line package (PDIP), a die in waffle pack, a die in wafer form, a chip on board (COB), a ceramic dual in line package (CERDIP), a plastic metric quad flat pack (MQFP), a thin quad flat pack (TQFP), a small outline integrated circuit (SOIC), a shrink small outline package (SSOP), a thin small outline package (TSOP), a system in package (SIP), a multi-chip package (MCP), a wafer-level fabricated package (WFP), a wafer-level processed stack package (WSP), etc.

Figure 7:
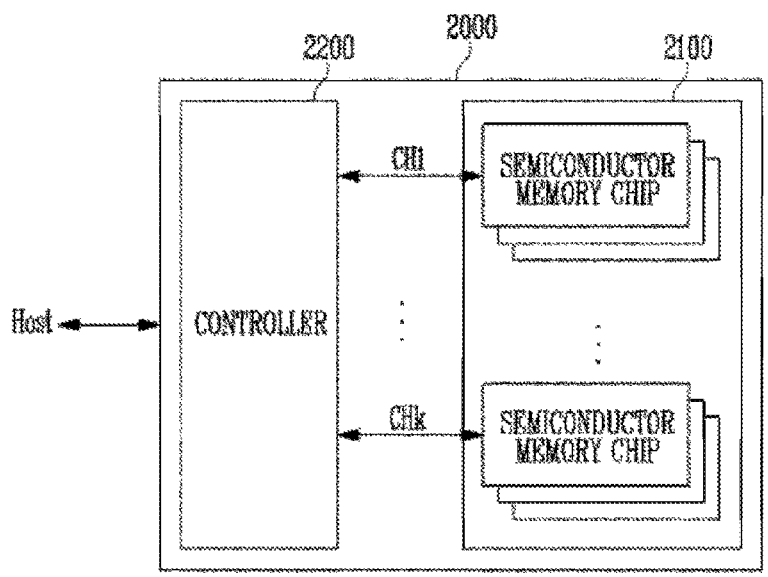
FIG. 7 is a block diagram showing an application example of the memory system of FIG. 6.

FIG. 7 is a block diagram showing an application example of the memory system of FIG. 6.

Referring to FIG. 7, the memory system 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 7, the plurality of groups are illustrated as communicating with the controller 2200 through first to $k^{th}$ channels CH1 to CHk. Each semiconductor memory chip may be configured and operate like one of the semiconductor memory devices 100 described with reference to FIG. 1.

Each group is configured to communicate to the controller 2200 through a common channel. The controller 2200 is configured like the controller 1100 described with reference to FIG. 7, and configured to control a plurality of memory chips of the semiconductor memory device 2100 through the plurality of channels CH1 to CHk.

Figure 8:
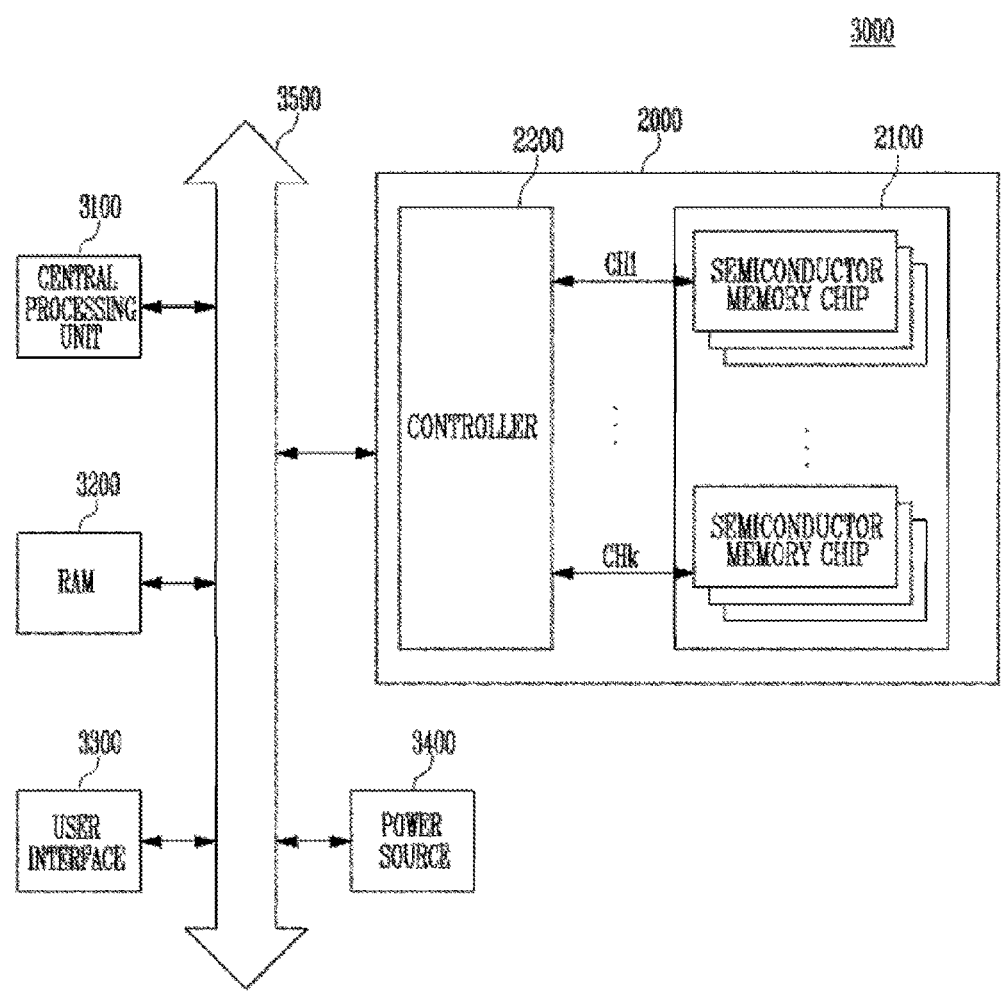
FIG. 8 is a block diagram showing a computing system including the memory system described with reference to FIG. 7.

FIG. 8 is a block diagram showing a computing system including the memory system described with reference to FIG. 7.

Referring to FIG. 8, the computing system 3000 includes a central processing unit 3100, a RAM 3200, a user interface 3300, a power source 3400, a system bus 3500, and a memory system 2000.

The memory system 2000 is electrically coupled to the central processing unit 3100, the RAM 3200, the user interface 3300 and the power source 3400 through the system bus 3500. Data provided through the user interface 3300 or processed by the central processing unit 3100 is stored in the memory system 2000.

In FIG. 8, the semiconductor memory device 2100 is illustrated as being coupled to the system bus 3500 through the controller 2200. However, the semiconductor memory device 2100 may be directly coupled to the system bus 3500. Here, a function of the controller 2200 may be performed by the central processing unit 3100 and the RAM 3200.

In FIG. 8, the memory system 2000 described with reference to FIG. 7 is illustrated as being provided. However, the memory system 2000 may be replaced with the memory system 1000 described with reference to FIG. 6. In an embodiment, the computing system 3000 may include both the memory systems 1000 and 2000 described with reference to FIGS. 7 and 6.

According to the invention, when a program operation of a semiconductor memory device having a 3-dimensional structure is performed, a first precharge voltage is applied to a first memory cell group coupled between a bit line and a pipe transistor, and a second precharge voltage is applied to a second memory cell group coupled between a source line and the pipe transistor, and thus precharge voltages of channels differ based on a pipe transistor, thereby compensating for different boosting levels according to locations of the memory cells and mitigating a program disturbance phenomenon when a next program voltage is applied.

In the drawings and specification, there have been disclosed typical embodiments of the invention, and although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the invention as defined by the following claims.

What is claimed is:

1. A semiconductor memory device, comprising:
a memory cell array including a plurality of strings, wherein each of the plurality of strings includes a first memory cell group, and a second memory cell group; and
peripheral circuits configured to generate a first precharge voltage applied to a first word lines of the first memory cell group and a second precharge voltage applied to a second word lines of the second memory cell group when a channel precharge operation is performed during a program operation, and generate a program voltage to apply the program voltage to the memory cell array when a program voltage application is performed.

2. The semiconductor memory device of claim 1, wherein the first memory cell group is electrically coupled between a drain select transistor and a pipe transistor, and the second memory cell group is electrically coupled between a source select transistor and the pipe transistor.

3. The semiconductor memory device of claim 1, wherein the first precharge voltage and the second precharge voltage have different potential levels.

4. The semiconductor memory device of claim 1, wherein the second precharge voltage is higher than the first precharge voltage by an offset voltage.

5. The semiconductor memory device of claim 1, wherein the peripheral circuits apply the first precharge voltage to the first memory cell group, and the second precharge voltage to the second memory cell group during the channel precharge operation.

6. The semiconductor memory device of claim 1, wherein the peripheral circuits apply the first precharge voltage and the second precharge voltage so that a potential level of a channel corresponding to the second memory cell group is higher than that of a channel corresponding to the first memory cell group.

7. The semiconductor memory device of claim 1, wherein the peripheral circuits comprise:
a voltage generator configured to generate the first precharge voltage, the second precharge voltage and the program voltage;
a control logic configured to control the voltage generator to have a difference by an offset voltage between the first precharge voltage and the second precharge voltage generated from the voltage generator; and
an address decoder configured to apply the first precharge voltage generated from the voltage generator to the first memory cell group, and the second precharge voltage to the second memory cell group.

8. A semiconductor memory device including a plurality of memory cells stacked on a substrate, comprising:
a first memory cell group and a second memory cell group;
a voltage generator configured to generate a first precharge voltage, a second precharge voltage and a program voltage; and
a controller configured to apply the first precharge voltage to a first word lines of the first memory cell group, and the second precharge voltage to a second word lines of the second memory cell group.

9. The semiconductor memory device of claim 8, wherein the first memory cell group is electrically coupled between a drain select transistor and a pipe transistor, and the second memory cell group is electrically coupled between a source select transistor and the pipe transistor.

10. The semiconductor memory device of claim 8, wherein the first precharge voltage and the second precharge voltage are different potential levels.

11. The semiconductor memory device of claim 8, wherein the second precharge voltage is higher than the first precharge voltage by an offset voltage.

12. The semiconductor memory device of claim 8, wherein the controller controls the voltage generator such that the second precharge voltage has a higher potential level than the first precharge voltage by an offset voltage.

13. The semiconductor memory device of claim 8, wherein the controller applies the first precharge voltage to the first memory cell group and the second precharge voltage to the second memory cell group during precharge operations of channels of the first memory cell group and the second memory cell group when a program operation is performed.

14. The semiconductor memory device of claim 8, wherein the controller applies the first precharge voltage and the second precharge voltage so that a potential level of a channel corresponding to the second memory cell group is higher than that of a channel corresponding to the first memory cell group.

15. The semiconductor memory device of claim 8, comprising:
- a control logic configured to control the voltage generator to have a difference by an offset voltage between the first precharge voltage and the second precharge voltage generated from the voltage generator; and
- an address decoder configured to apply the first precharge voltage generated from the voltage generator to the first memory cell group, and the second precharge voltage generated from the voltage generator to the second memory cell.

16. An operating method of a semiconductor memory device, comprising:
- providing a semiconductor device including a a first memory cell group and a second memory cell group;
- applying a first precharge voltage to a first word lines of the first memory cell group and a second precharge voltage to a second word lines of the second memory cell group, and precharging channels corresponding to the first memory cell group and the second memory cell group; and
- applying a program voltage to a memory cell group selected from the first memory cell group and the second memory cell group.

17. The operating method of claim 14, wherein the first precharge voltage and the second precharge voltage are different potential levels.

18. The operating method of claim 14, wherein the second precharge voltage is higher than the first precharge voltage by an offset voltage.

19. The operating method of claim 14, wherein, in the precharging of the channels, a precharge potential level of a channel corresponding to the second memory cell group is higher than that of a channel corresponding to the first memory cell group.

20. The semiconductor memory device of claim 13, wherein the control logic is configured to control the voltage generator to generate the first precharge voltage and the second precharge voltage to apply to a memory cell array prior to the program voltage.

* * * * *